(12) United States Patent
Ichikawa et al.

(10) Patent No.: US 11,523,515 B2
(45) Date of Patent: Dec. 6, 2022

(54) METHOD FOR MANUFACTURING WIRING SUBSTRATE

(71) Applicant: IBIDEN CO., LTD., Gifu (JP)

(72) Inventors: Shinichiro Ichikawa, Ogaki (JP); Takanori Doi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/155,177

(22) Filed: Jan. 22, 2021

(65) Prior Publication Data

US 2021/0235584 A1    Jul. 29, 2021

(30) Foreign Application Priority Data

Jan. 24, 2020 (JP) .............................. JP2020-010109

(51) Int. Cl.
*H05K 3/06* (2006.01)
*H05K 3/24* (2006.01)
*H05K 3/26* (2006.01)
*H05K 1/02* (2006.01)
*H05K 1/09* (2006.01)

(52) U.S. Cl.
CPC .......... *H05K 3/061* (2013.01); *H05K 1/0296* (2013.01); *H05K 1/09* (2013.01); *H05K 3/241* (2013.01); *H05K 3/26* (2013.01); *H05K 2201/0338* (2013.01); *H05K 2201/0355* (2013.01)

(58) Field of Classification Search
CPC ........ H05K 3/06; H05K 3/061; H05K 1/0296; H05K 1/09; H05K 3/241; H05K 3/26; H05K 2201/0338; H05K 2201/0355
USPC .......................................................... 175/250
See application file for complete search history.

(56) References Cited

U.S. PATENT DOCUMENTS

2018/0116057 A1* 4/2018 Kajihara .............. H05K 3/0032

FOREIGN PATENT DOCUMENTS

JP          2000-323814 A       11/2000

* cited by examiner

*Primary Examiner* — Tremesha S Willis
(74) *Attorney, Agent, or Firm* — Oblon, McClelland, Maier & Neustadt, L.L.P.

(57) ABSTRACT

A method for manufacturing a wiring substrate includes forming a plating film on a metal foil laminated on a surface of an insulating layer, forming an etching resist on the plating film such that the etching resist has an opening for forming a conductor pattern, conducting a first etching process such that part of the plating film exposed from the opening of the etching resist is removed and that part of the metal foil is exposed, removing the etching resist from the plating film on the metal foil laminated on the surface of an insulating layer, and conducting a second etching process such that the part of the metal foil exposed by the first etching process is removed and that a conductor layer having the conductor pattern is formed on the surface of the insulating layer.

20 Claims, 5 Drawing Sheets

METHOD FOR MANUFACTURING WIRING SUBSTRATE

CROSS-REFERENCE TO RELATED APPLICATIONS

The present application is based upon and claims the benefit of priority to Japanese Patent Application No. 2020-010109, filed Jan. 24, 2020, the entire contents of which are incorporated herein by reference.

BACKGROUND OF THE INVENTION

Field of the Invention

The present invention relates to a method for manufacturing a wiring substrate.

Description of Background Art

Japanese Patent Application Publication No. 2000-323814 describes a method for manufacturing a wiring board in which a copper plating layer including an electroless copper plating layer and an electrolytic copper plating layer is formed on an insulating layer and the copper plating layer is subjected to pattern processing by etching using an etching resist. An unwanted portion of the copper plating layer is removed by the pattern processing and a conductor pattern is formed by the remaining copper plating layer. The entire contents of this publication are incorporated herein by reference.

SUMMARY OF THE INVENTION

According to one aspect of the present invention, a method for manufacturing a wiring substrate includes forming a plating film on a metal foil laminated on a surface of an insulating layer, forming an etching resist on the plating film such that the etching resist has an opening for forming a conductor pattern, conducting a first etching process such that part of the plating film exposed from the opening of the etching resist is removed and that part of the metal foil is exposed, removing the etching resist from the plating film on the metal foil laminated on the surface of an insulating layer, and conducting a second etching process such that the part of the metal foil exposed by the first etching process is removed and that a conductor layer having the conductor pattern is formed on the surface of the insulating layer.

According to another aspect of the present invention, a wiring substrate includes an insulating layer; and a conductor layer formed on a surface of the insulating layer and including a metal foil laminated on the surface of the insulating layer and a plating film formed on the metal foil. The conductor layer has a conductor pattern formed such that the conductor pattern of the conductor layer has a rounded end portion at an upper periphery and that a bottom width of the conductor pattern at a lower periphery is greater than a top width of the conductor pattern at the upper periphery

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1:
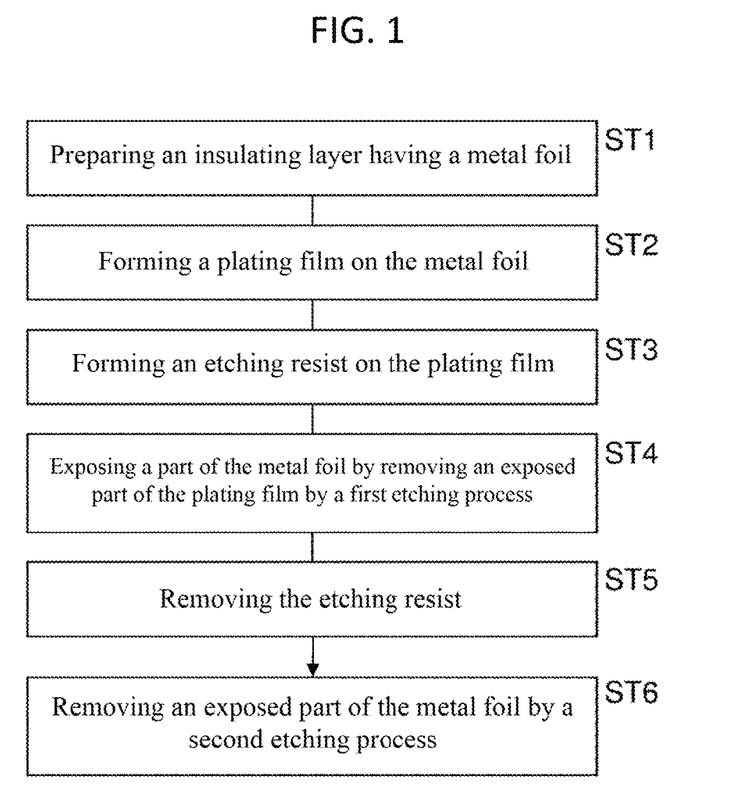
FIG. 1 is a flowchart illustrating an example of a method for manufacturing a wiring substrate according to an embodiment of the present invention.

A method for manufacturing a wiring substrate according to an embodiment of the present invention is described with reference to the drawings. FIG. 1 is a flowchart illustrating an example of the method for manufacturing the wiring substrate of the embodiment. FIGS. 2A-2F illustrate some examples of the wiring substrate in processes of the method for manufacturing the wiring substrate of the embodiment. Further, FIG. 3 illustrates a part of a wiring substrate 100 which is an example of the wiring substrate manufactured using the method for manufacturing the wiring substrate of the embodiment.

Figure 2A:
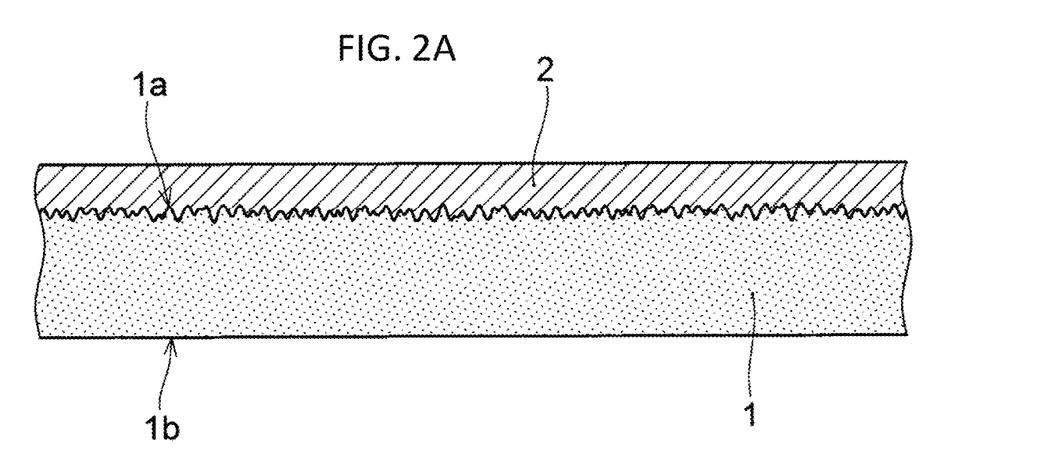
FIG. 2A is a cross-sectional view illustrating an example of preparation of an insulating layer in the method for manufacturing a wiring substrate according to the embodiment of the present invention.
Figure 2B:
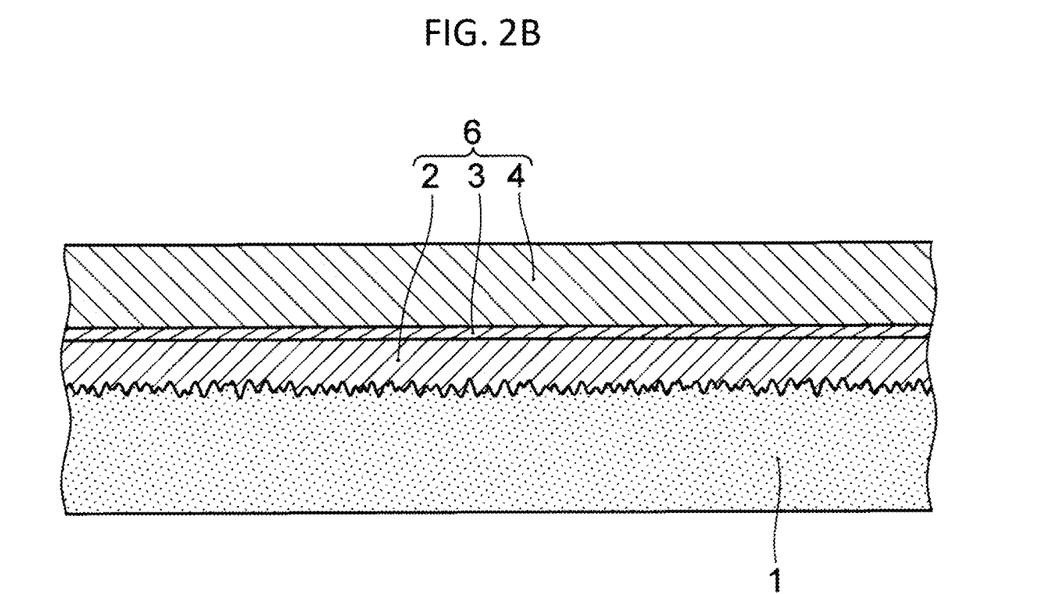
FIG. 2B is a cross-sectional view illustrating an example of formation of a plating film in the method for manufacturing a wiring substrate according to the embodiment of the present invention.
Figure 2C:
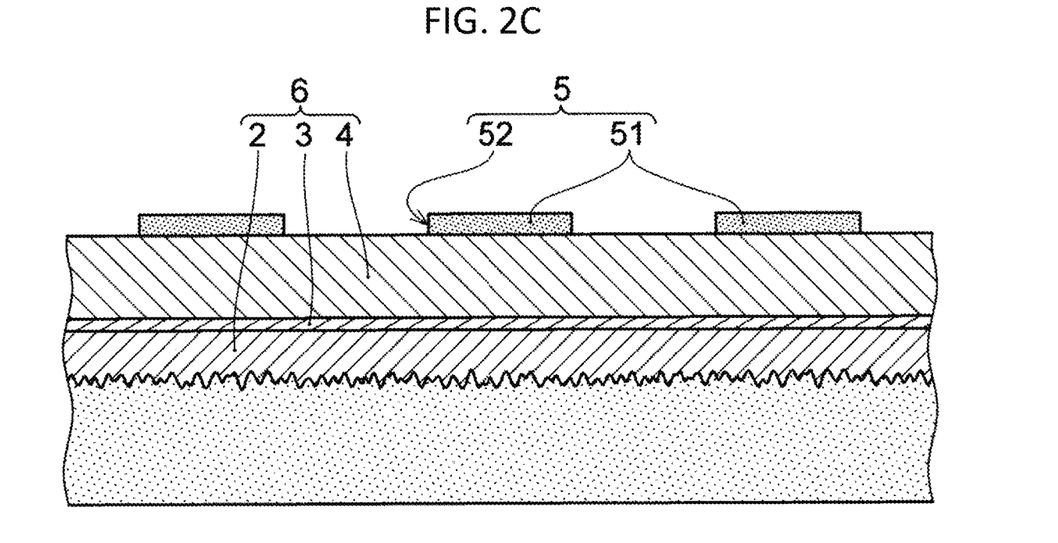
FIG. 2C is a cross-sectional view illustrating an example of formation of an etching resist in the method for manufacturing a wiring substrate according to the embodiment of the present invention.
Figure 2D:
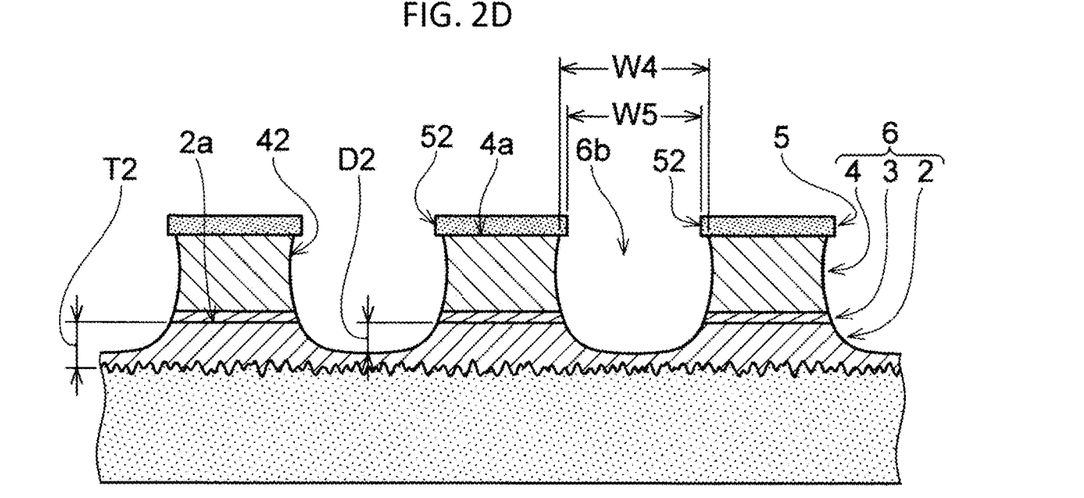
FIG. 2D is a cross-sectional view illustrating an example of a first etching process in the method for manufacturing a wiring substrate according to the embodiment of the present invention.

As illustrated in Process ST1 of FIG. 1 and in FIG. 2A, the method for manufacturing the wiring substrate of the present embodiment includes preparing an insulating layer 1 having a metal foil 2 on at least one surface thereof. In the example of FIG. 2A, the metal foil 2 is provided on a surface (1a) of the insulating layer 1. The method for manufacturing the wiring substrate of the present embodiment further includes forming a plating film 4 on the metal foil 2 as illustrated in FIG. 2B (Process ST2 of FIG. 1), and includes partially forming an etching resist 5 on the plating film 4 as illustrated in FIG. 2C (Process ST3 of FIG. 1). In the example of FIGS. 2B and 2C, a metal film 3 is formed on a surface of the metal foil 2 on an opposite side with respect to the insulating layer 1, and the plating film 4 is formed on a surface of the metal film 3 on an opposite side with respect to the metal foil 2. The method for manufacturing the wiring substrate of the present embodiment further includes etching the plating film 4 exposed from the etching resist 5 (first etching process) and thereby exposing a portion of the metal foil 2 as illustrated in FIG. 2D (Process ST4 of FIG. 1). A portion of the metal film 3 exposed by the removal of the plating film 4 is also removed by the first etching process.

Figure 2E:
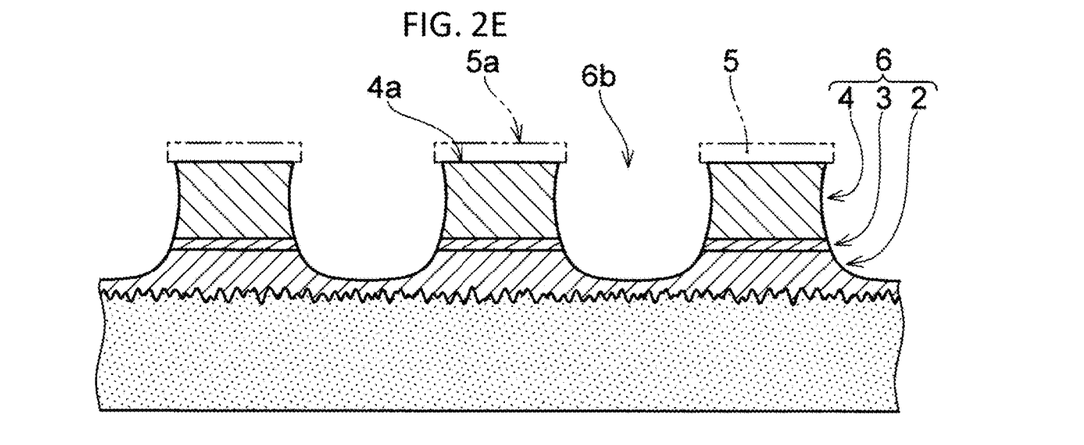
FIG. 2E is a cross-sectional view illustrating an example of a state after removal of the etching resist in the method for manufacturing a wiring substrate according to the embodiment of the present invention.
Figure 2F:
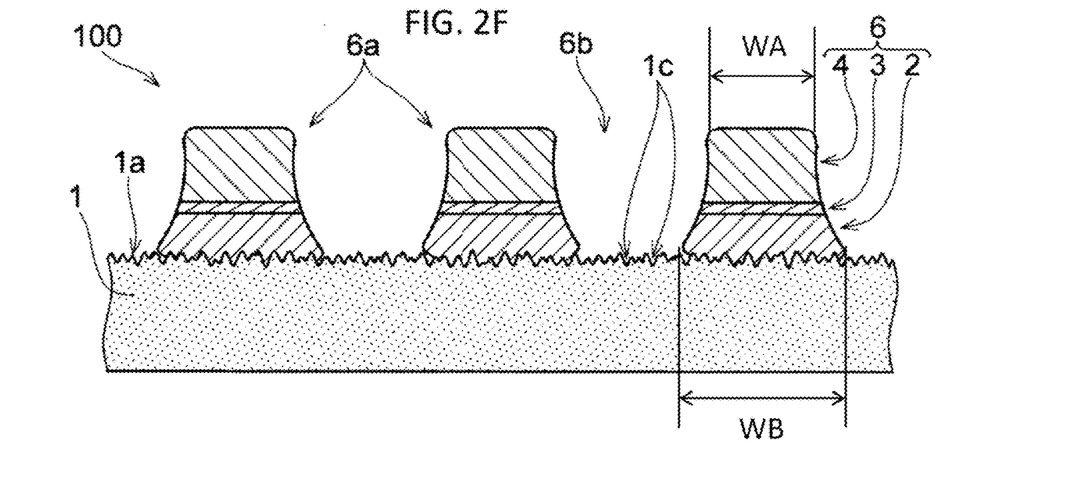
FIG. 2F is a cross-sectional view illustrating an example of a second etching process in the method for manufacturing a wiring substrate according to the embodiment of the present invention.

The method for manufacturing the wiring substrate of the present embodiment further includes removing the etching resist 5 as illustrated in FIG. 2E (Process ST5 of FIG. 1), and includes removing an exposed portion of the metal foil 2 by etching (second etching process) as illustrated in FIG. 2F (Process ST6 of FIG. 1). That is, in the method for manufacturing the wiring substrate of the present embodiment, the etching resist 5 is removed before the second etching process. Predetermined conductor patterns (6a) are formed by the second etching process. The conductor patterns (6a) form a part of a conductor layer 6. The conductor layer 6 is a conductor layer formed on the surface (1a) of the insulating layer 1. Thus, the method for manufacturing the wiring substrate of the present embodiment includes forming the conductor layer 6 including the predetermined conductor patterns (6a) by the second etching process. That is, the method for manufacturing the wiring substrate of the present embodiment includes formation of a conductor pattern using a subtractive method.

Figure 3:
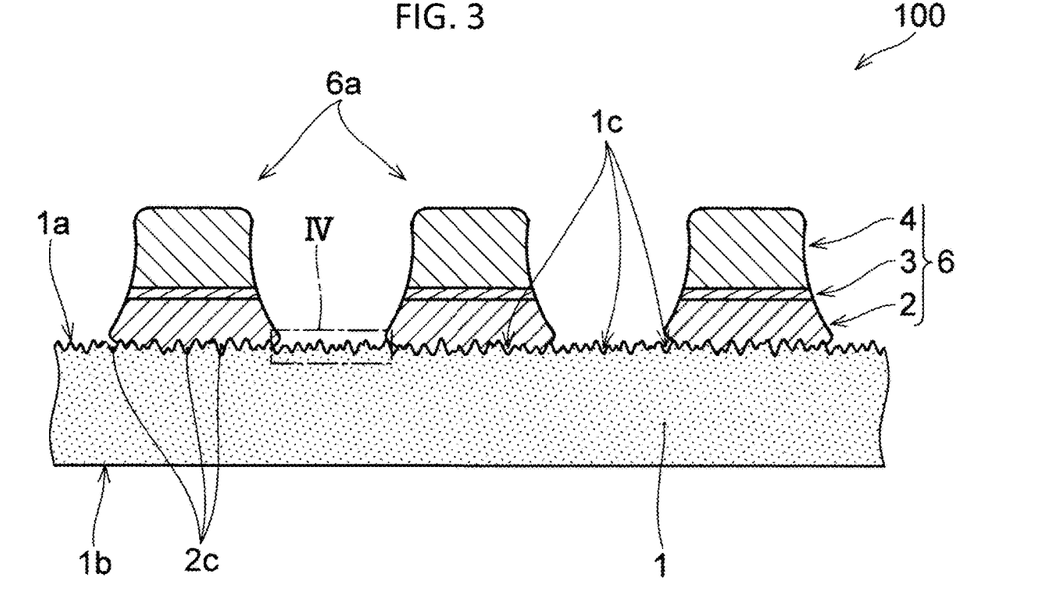
FIG. 3 is a cross-sectional view illustrating an example of a wiring substrate manufactured using the method for manufacturing a wiring substrate according to the embodiment of the present invention.

As illustrated in FIG. 3, the wiring substrate 100 manufactured using the method for manufacturing the wiring substrate of the present embodiment includes the insulating layer 1 and the conductor layer 6 which is laminated on one surface (the surface (1a)) of the insulating layer 1. The wiring substrate 100 may further include one or more pairs of insulating layers and conductor layers on the surface (1a) side. Further, the wiring substrate 100 may also include a conductor layer on a surface (1b) side which is an on an opposite side with respect to the surface (1a). In this case, one or more pairs of insulating layers and conductor layers may be further provided on the conductor layer on the surface (1b) side. That is, the wiring substrate 100 may be a so-called single-sided substrate or double-sided substrate, and may be a multilayer wiring substrate. Further, the insulating layer 1 may be an insulating layer of a core substrate of the wiring substrate 100, or may be an interlayer insulating layer of a build-up layer. Further, the conductor layer 6 may be a surface-layer conductor layer of the wiring substrate 100, or may be an inner-layer conductor layer when the wiring substrate 100 is a multilayer wiring substrate. The method for manufacturing the wiring substrate of the present embodiment can be used for manufacturing a wiring substrate having any structure and any layer structure.

The conductor layer 6 in the example of FIG. 3 has a three-layer structure including a lower layer formed of the metal foil 2, a middle layer formed of the metal film 3, and an upper layer formed of the plating film 4. An example of the plating film 4 is an electrolytic plating film of copper. However, the plating film 4 may be a plating film formed of a metal other than copper such as nickel. When the plating film 4 is an electrolytic plating film, the metal film 3 functions as a plating current feeding layer and/or a seed layer when the plating film 4 is formed. The metal film 3 is, for example, an electroless plating film of copper or a sputtering film of copper. It is possible that the metal film 3 is not formed. Examples of the metal foil 2 include an electrolytic metal foil, and a rolled metal foil. However, the metal foil 2 is not limited to these. The metal foil 2 is, for example, a copper foil. However, it is also possible that the metal foil 2 is a foil body formed of other metals such as nickel and silver.

A surface (bonding surface) of the metal foil 2 facing the insulating layer 1 side is roughened, and multiple protrusions (2c) are formed on the bonding interface. The metal foil 2 is bonded to the insulating layer 1 by, for example, thermocompression bonding. The protrusions (2c) of the metal foil 2 fit into the surface (1a) of the insulating layer 1 during the bonding. Therefore, the surface (1a) of the insulating layer 1 has multiple recesses (1c) formed by the protrusions (2c), and the recesses (1c) mesh with the protrusions (2c) of the metal foil. Since a so-called anchor effect is obtained by the meshing of the protrusions (2c) and the recesses (1c), a strong bond between the metal foil 2 and the insulating layer 1 is obtained.

In the conductor layer 6, as described above, in order to form the desired conductor patterns (6a), unwanted portions other than the conductor patterns (6a) are removed by etching. However, when the removal by the etching is not sufficient, a part of the conductor layer 6, such as the metal foil 2, may remain on the surface (1a) of the insulating layer 1. In particular, when a large number of the recesses (1c) exist as illustrated in FIG. 3, a part of the metal foil 2 is likely to remain as metal residues on the surface (1a).

Figure 4:
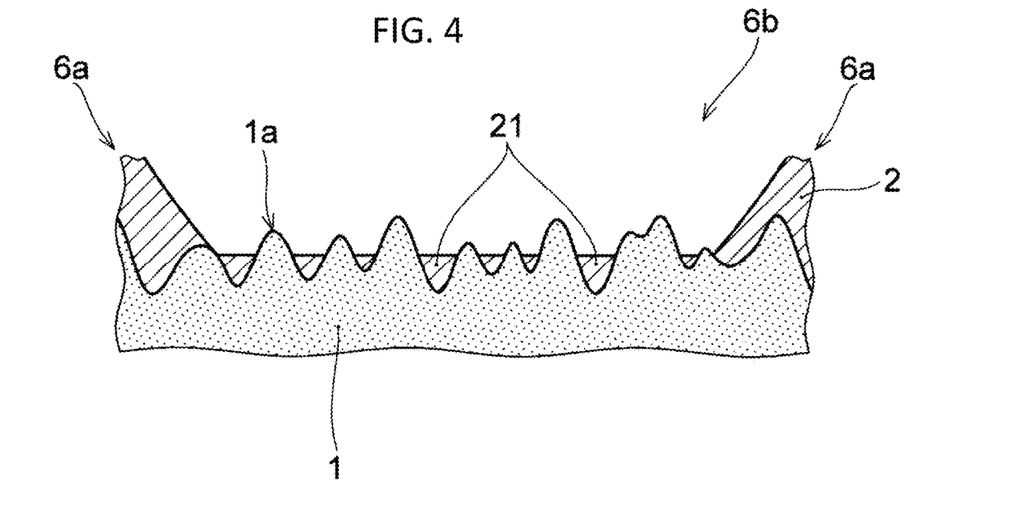
FIG. 4 is an enlarged view illustrating an example of a metal foil remaining on a surface of an insulating layer when the method for manufacturing a wiring substrate according to the embodiment is not used.

FIG. 4 illustrates an example of a part of the metal foil 2 (metal residues 21) remaining on the surface of the insulating layer 1 when the method for manufacturing the wiring substrate of the present embodiment is not used. FIG. 4 is an enlarged view of a portion corresponding to a portion (IV) of the wiring substrate 100 of FIG. 3 in the example of FIG. 4. As illustrated in FIG. 4, when the etching process for removing the metal foil 2 on the surface (1a) of the insulating layer 1 is not appropriate, even after patterning of the conductor layer, a part of the metal foil 2 may remain on the surface (1a) and becomes the metal residues 21. For example, as the etching progresses, a depth from a surface of the etching resist to a bottom of a portion already removed in the conductor layer (cavity (6b)) increases. Therefore, it is thought that, by the time the metal foil 2 is exposed, it becomes difficult for an etching solution to flow to an exposed portion of the metal foil 2. As a result, it is possible that a part of the metal foil 2 remains. In particular, as in the example of FIG. 4, a part of the metal foil 2 that has entered the recesses (1c) is likely to remain as the metal residues 21. When the metal residues 21 are present between the conductor patterns (6a) (for example, wiring patterns), insulation between the conductor patterns (6a) may decrease. In particular, in a wiring substrate in which conductor patterns are adjacent to each other in a so-called fine pitch formation in which distances between adjacent conductor patterns (6a) are small, the presence of the metal residues 21 is likely to cause a problem.

It is thought that the removal of the metal foil 2 on the surface (1a) of the insulating layer 1 can be promoted by increasing an etching time or by adjusting a concentration of a reaction component in an etching solution or by adjusting an etching temperature. However, in this case, it is thought that unintended side etching against the conductor patterns (6a) to be retained also proceeds. As a countermeasure, it is conceivable to increase an amount of an additive such as a side etching inhibitor in an etching solution. However, it is difficult to stably balance an etching rate in a thickness direction and a side etching rate in both the metal foil 2 and the plating film 4, which have different internal structures. Therefore, it is possible that conductor patterns (6a) having intended shapes, for example, wiring patterns having intended wiring widths can not be obtained.

The method for manufacturing the wiring substrate of the present embodiment includes the first etching process and the second etching process to promote the removal of the metal foil 2 on the surface (1a) of the insulating layer 1 while suppressing such excessive side etching. The first etching process is performed using the etching resist 5 having openings corresponding to the conductor patterns (6a). The first etching process mainly removes the plating film 4 exposed in the openings of the etching resist 5, and exposes at least a portion of the metal foil 2. As in the example of FIG. 3, when the metal film 3 is interposed between the plating film 4 and the metal foil 2, the first etching process exposes the metal foil 2 by also removing the metal film 3 exposed by the removal of the plating film 4.

In the first etching process, since the plating film 4 is mainly removed, an etching condition can be selected based on its suitability for the removal of the plating film 4 (or, the plating film 4 and the metal film 3). For example, since the first etching process is performed until at least the metal foil 2 is exposed, it is preferable to use an etching solution or an etching condition such that an etching rate is high in the thickness direction of the plating film 4. In addition, since the time of the first etching process performed until the metal foil 2 is exposed is relatively long, a side etching amount tends to increase. In this regard, as will be described later, it may be preferable that the plating film 4 is moderately side-etched from a point of view of proper removal of the metal foil 2. Therefore, for example, based on a crystal structure of the plating film 4, an etching solution is prepared such that the etching rate in the thickness direction of the plating film 4 is not excessively limited, and, preferably, the side etching is appropriately suppressed.

On the other hand, in the second etching process, the metal foil 2 is mainly removed. The second etching process can include removing the metal residues 21 in the recesses (1c) of the surface (1a) of the insulating layer 1. The second etching process is performed after the etching resist 5 is removed. Therefore, in the second etching process, as compared to the case where the etching resist 5 is present on the surface of the plating film 4, it is easier for an etching solution to flow to an exposed portion of the metal foil 2 at least for the thickness of the etching resist 5. Therefore, as compared to the case where the first etching process is continued, the removal of the metal foil 2 can be promoted. Further, since the removal of the metal foil 2 is promoted, even when the second etching process is continued until the metal foil 2 on the surface (1a) of the insulating layer 1 disappears, a side etching amount is thought to be less than that in the case where the first etching process is continued.

Further, in the second etching process, since the metal foil 2 is mainly removed, an etching condition can be selected based on its suitability for the removal of the metal foil 2. For example, since the crystal structure is different between an electrolytic copper foil and a rolled copper foil, an etching solution suitable for the structure of the metal foil 2 can be selected. Further, since the second etching process is performed after the etching resist 5 is removed, the surface of the plating film 4 is exposed during the second etching process. Therefore, in the second etching process, an etching solution that is difficult to dissolve the plating film 4 may be used.

On the other hand, there may be a case where the thickness of the metal foil 2 to be removed by the second etching process is smaller than the thickness of the plating film 4 to be removed by the first etching process. Therefore, the time of the second etching process may be shorter than the time of the first etching process. Therefore, the side etching amount in the second etching process may be less than the side etching amount in the first etching process.

Further, it is thought to be preferable that the second etching process in which the upper surface of the plating film 4 (the surface on an opposite side with respect to the metal foil 2) is exposed to an etching solution is performed in a time as short as possible. Therefore, the second etching process may be performed at a higher etching rate than the first etching process at least in the thickness direction of the metal foil 2 and the plating film 4.

The processes of the method for manufacturing the wiring substrate of the present embodiment are described in detail again with reference to FIGS. 2A-2F. FIGS. 2A-2F illustrate an example of the wiring substrate 100 in a process of being manufactured in the processes in the case where the wiring substrate 100 of FIG. 3 is manufactured.

As illustrated in FIG. 2A, the insulating layer 1 is prepared. The metal foil 2 is provided on the surface (1a) which is one of two surfaces (main surfaces) perpendicular to the thickness direction of the insulating layer 1. The metal foil 2 and the insulating layer 1 are bonded to each other, for example, by thermal compression bonding. Examples of the metal foil 2 include a copper foil, a nickel foil, and the like. However, a metal forming the metal foil 2 is not particularly limited. The insulating layer 1 can be formed of any insulating resin. Examples of the insulating resin include an epoxy resin, a bismaleimide triazine resin (BT resin), a phenol resin, and the like. The insulating layer 1 formed using these insulating resins may contain an inorganic filler such as silica. Further, the insulating layer 1 may contain a reinforcing material (not illustrated in the drawings) formed of a glass fiber, an aramid fiber, a glass non-woven fabric, an aramid non-woven fabric, or the like.

Although not illustrated in the drawings, a metal foil may also be bonded to a surface (surface (1b)) of the insulating layer 1 on an opposite side with respect to the surface (1a). For example, a double-sided copper-clad laminated plate including the insulating layer 1 and metal foils 2 of copper on the surfaces (1a, 1b) of the insulating layer 1 may be prepared as a starting substrate. Further, one or more pairs of conductor layers and insulating layers may be laminated on the surface (1b) side. For example, a multilayer wiring substrate including the insulating layer 1 and the metal foil 2 in a process of being manufactured using a build-up method may be prepared. That is, an outermost insulating layer of a multilayer wiring substrate in a process of being manufactured may the insulating layer 1 of FIG. 2A.

In the insulating layer 1 and the metal foil 2 that have been prepared, through holes for forming via conductors or through-hole conductors (not illustrated in the drawings) penetrating the insulating layer 1 may be formed.

As illustrated in FIG. 2B, the metal film 3 is formed on a surface of the metal foil 2 on an opposite side with respect to the insulating layer 1. Further, the plating film 4 is formed on a surface of the metal film 3 on an opposite side with respect to the metal foil 2. The metal film 3 is formed on the entire surface of the metal foil 2 by, for example, electroless plating or sputtering or the like. Examples of the material of the metal film 3 include copper, nickel, and the like. However, the material of the metal film 3 is not limited to these.

The plating film 4 is formed on the metal film 3 by, for example, electrolytic plating or electroless plating or the like. When the plating film is formed by an electrolytic plating, the metal film 3 can be used as a power feeding layer when the plating film 4 is formed. For example, by immersing the wiring substrate in a process of being manufactured in an electrolytic solution containing copper sulfate or the like and energizing it, an electrolytic plating film of copper is formed as the plating film 4 on the entire surface of the metal film 3. A material for forming the plating film 4 may be a metal other than copper such as nickel. Preferably, the metal foil 2, the metal film 3, and the plating film 4 are formed of the same metallic material. By the formation of the plating film 4, the formation of the conductor layer 6 before patterning is completed.

In the case where the plating film 4 is formed by electroless plating, it is not necessary to form the metal film 3. Further, even in the case where the plating film 4 is formed by electrolytic plating, when the above-described via conductors or the like (not illustrated in the drawings) are not provided in the insulating layer 1, it is not necessary to form the metal film 3. The plating film 4 can be formed on the surface of the metal foil 2 by electrolytic plating using the metal foil 2 as a power feeding layer.

As illustrated in FIG. 2C, the etching resist 5 is formed on the plating film 4. Mask parts 51 of the etching resist 5 are provided at regions corresponding to formation sites of conductor patterns in the conductor layer 6. Openings 52 each having a predetermined opening width are provided in etching resist 5 at regions corresponding to regions where conductor patterns are not provided.

For example, a resist film formed of a photosensitive organic material is laminated on the plating film 4. Instead of laminating a resist film, a resist film may be formed on the plating film 4 by applying a liquid photosensitive organic material on the plating film 4 and curing it in a semi-cured state. Then, an exposure mask (not illustrated in the drawings) having openings corresponding to the conductor patterns to be provided in the conductor layer 6 is superposed on the resist film provided on the plating film 4. The resist film is exposed by irradiation with ultraviolet light through the exposure mask, and an exposed part is altered according to attributes (positive/negative) of the resist film. After that, an exposed part or an unexposed part of the resist film is removed by development. as a result, the etching resist 5 as illustrated in FIG. 2C having the mask parts 51 and the openings 52 in desired regions is formed.

As illustrated in FIG. 2D, the plating film 4 exposed in the openings 52 of the etching resist 5 is removed by the first etching process. The first etching process is performed, for example, by spraying an etching solution onto the wiring substrate in a process of being manufactured or by immersing the wiring substrate in the etching solution. However, the processing method of the first etching process is not limited to these.

In the example of FIG. 2D, by the first etching process, the cavities (6b) that each open with an opening width larger than an opening width (W5) of each of the openings 52 of the etching resist 5 are formed in the plating film 4. That is, in the example of FIG. 2D, in addition to a portion of the plating film 4 exposed from the etching resist 5, a portion surrounding the exposed portion of the plating film 4 in a plan view is also removed. As a result, openings 42 that overlap with the openings 52 of the etching resist 5 in a plan view and each have an opening width (W4) larger than the opening width (W5) are provided in a surface (4a) of the plating film 4. In other words, the cavities (6b) having the openings (openings 42) larger than the openings 52 of the etching resist 5 on the surface (4a) are formed in the conductor layer 6.

In the example of FIG. 2D, by removing the etching resist 5 after the first etching process, inflow openings to the cavities (6b) for an etching solution (second etching solution) used in the subsequent second etching process are expanded as compared to those before the removal of the etching resist 5. Therefore, it is thought that the second etching solution can easily reach the metal foil 2 and, as a result, the removal of the metal foil 2 is further promoted. The openings 42 as in the example of FIG. 2D can be formed, for example, by appropriately selecting a content of a side etching inhibitor in an etching solution (first etching solution) used in the first etching process, etching conditions such as time and temperature, a material of the plating film 4, and the like.

The term "plan view" refers to a way of viewing the wiring substrate 100 from outside, and means to view the wiring substrate 100 along a direction parallel to the thickness direction of the wiring substrate 100. Further, the term "opening width" means a length along any one direction in a plan view of the openings 42 or the openings 52. That is, for example, when the openings 42 or the openings 52 each have a longitudinal direction in a plan view, the "opening width" may be a length in the longitudinal direction of each of the openings, or may be a length in a direction orthogonal to the longitudinal direction. Further, when the openings each have a planar shape of a circle or an ellipse, the "opening width" may be a diameter, a major axis, or a minor axis of each of the openings.

When the metal film 3 is formed as in the example of FIG. 2D, the metal film 3 exposed by the removal of the plating film 4 is also removed by the first etching process. In this way, the first etching process is performed until at least a part of the metal foil 2 is exposed. By the removal of the plating film 4 and the metal film 3, the cavities (6b) are formed in the conductor layer 6.

For the first etching solution, an appropriate etching solution for etching the plating film 4, which is mainly formed by electrolytic plating or the like, is used. The first etching solution contains, for example, copper chloride, or iron chloride, or the like. The first etching solution containing copper chloride may contain cuprous chloride, cupric chloride, hydrochloric acid, and the like. Further, the first etching solution containing iron chloride may contain ferric chloride, hydrochloric acid, and the like.

Further, the first etching solution may contain an additive that is contained to moderately suppress side etching. For example, the first etching solution may contain an ionic and/or nonionic surfactant, or a polyamine compound as a side etching inhibitor. As in the example of FIG. 2D, when it is intended to provide in the conductor layer 6 the openings 42 each having the opening width (W4) larger than the opening width (W5) of the etching resist 5, the amount of the side etching inhibitor (additive) is appropriately adjusted.

In the example of FIG. 2D, by the first etching process, the metal foil 2 is also partially removed in the thickness direction. An etching depth (D2) of the metal foil 2 from a surface (2a) of the metal foil 2 on the plating film 4 side is, for example, ⅓ or more and ⅔ or less of a thickness (T2) of the metal foil 2. Even when the etching rate of the metal foil 2 by the first etching solution is relatively slow, it is thought that the first etching process can be completed without requiring an excessive time, and the second etching process performed after the removal of the etching resist 5 can be promptly completed. The thickness (T2) of the metal foil 2 is, for example, 5 μm or more and 15 μm or less. Further, in this case, for example, a thickness of the metal film 3 is 1 μm or more and 4 μm or less, and a thickness of the plating film 4 is 15 μm or more and 30 μm or less.

As illustrated in FIG. 2E, the etching resist 5 is removed. For example, the etching resist 5 formed of an organic material is removed using a solution of sodium hydroxide, potassium hydroxide, or the like. For example, the etching resist 5 is removed by immersion in these solutions or by spraying the solutions. By the removal of the etching resist 5, it is thought that, in the subsequent second etching process, the second etching solution can easily reach the metal foil 2 exposed at the bottoms of the cavities (6b). That is, by removing the etching resist 5, inflow openings for the second etching solution to the cavities (6b) shift from a surface (5a) of the etching resist 5 to the surface (4a) of the plating film 4 (a surface thereof on the etching resist 5 side). A depth of each of the cavities (6b) for the second etching solution becomes shallower than that before the removal of the etching resist 5. Further, in the example of FIG. 2E, as described above, an opening width of each of the inflow openings for the second etching solution also becomes wider than that before the removal of the etching resist 5. Therefore, the second etching solution easily reaches the metal foil 2 exposed at the bottoms of the cavities (6b), and, as a result, the removal of the metal foil 2 by the second etching process is promoted.

As illustrated in FIG. 2F, the upper and lower edge portions of the conductor patterns (6a) and the portion of the metal foil 2 exposed in the cavities (6b) are removed by the second etching process. As a result, the desired conductor patterns (6a) adjacent to each other across conductor non-forming regions formed of the cavities (6b) are formed with rounded end portions at their upper and lower peripheries. The formation of the conductor layer 6 including the desired conductor patterns (6a) is completed. The conductor pattern (6a) is formed such that a bottom width (WB) at the lower periphery is greater than a top width (WA) at the upper periphery.

By the second etching process, the metal foil 2 remaining at the bottoms of the cavities (6b), that is, the metal foil 2 remaining between adjacent conductor patterns (6a), is substantially completely removed. It is thought that, of the metal foil 2, all portions entered the recesses (1c) of the insulating layer 1 are also removed. Therefore, insulation between the conductor patterns (6a) is unlikely to decrease. A wiring substrate 100 highly reliable in insulation can be obtained.

The second etching process is performed by spraying the second etching solution onto the wiring substrate after the removal of the etching resist 5, or by immersing the wiring substrate in the second etching solution. However, the processing method of the second etching process is not limited to these. Further, the second etching process only removes the metal foil 2 remaining in the cavities (6b), and thus, is shorter in processing time than the first etching process. The processing time of the second etching process is, for example, 1/5 or less of the processing time of the first etching process. When the processing time of the second etching process is short, excessive etching against the plating film 4 exposed by the removal of the etching resist 5 can be suppressed.

As the second etching solution, an etching solution suitable for etching the metal foil 2 is used. Preferably, an etching solution that quickly dissolves the metal foil 2 but is difficult to dissolve the plating film 4 is used as the second etching solution. The second etching solution contains, for example, sulfuric acid and hydrogen peroxide. It is also possible that the second etching solution is an alkaline etching solution other than a sulfuric acid-hydrogen peroxide etching solution, or is an organic acid etching solution.

Similar to the first etching solution, the second etching solution can also contain an additive having a side etching inhibitory effect. A content of such an additive may be higher in the second etching solution than in the first etching solution. The second etching solution may contain, for example, a surfactant or a polyamine compound as a side etching inhibitor (additive).

Through the above processes, the wiring substrate 100 in the state of FIG. 3 is completed. In the wiring substrate 100, one or more pairs of insulating layers and conductor layers may be further laminated on either one or both sides of the insulating layer 1. Further, in the wiring substrate 100, a solder resist (not illustrated in the drawings) may be formed on the outermost conductor layer and insulating layer. Further, a surface protective film formed of gold or the like may be formed by electroless plating or the like on an exposed portion of the conductor layer in the wiring substrate 100.

Figure 5:
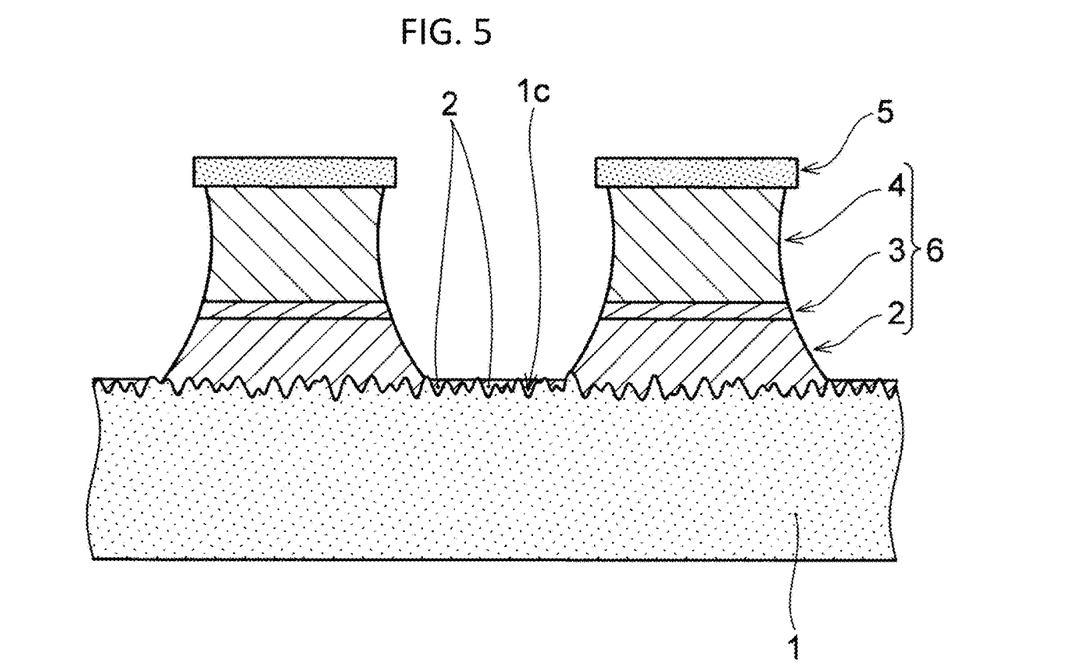
FIG. 5 is a cross-sectional view illustrating another example of the first etching process in the method for manufacturing a wiring substrate according to the embodiment of the present invention.
Figure 6:
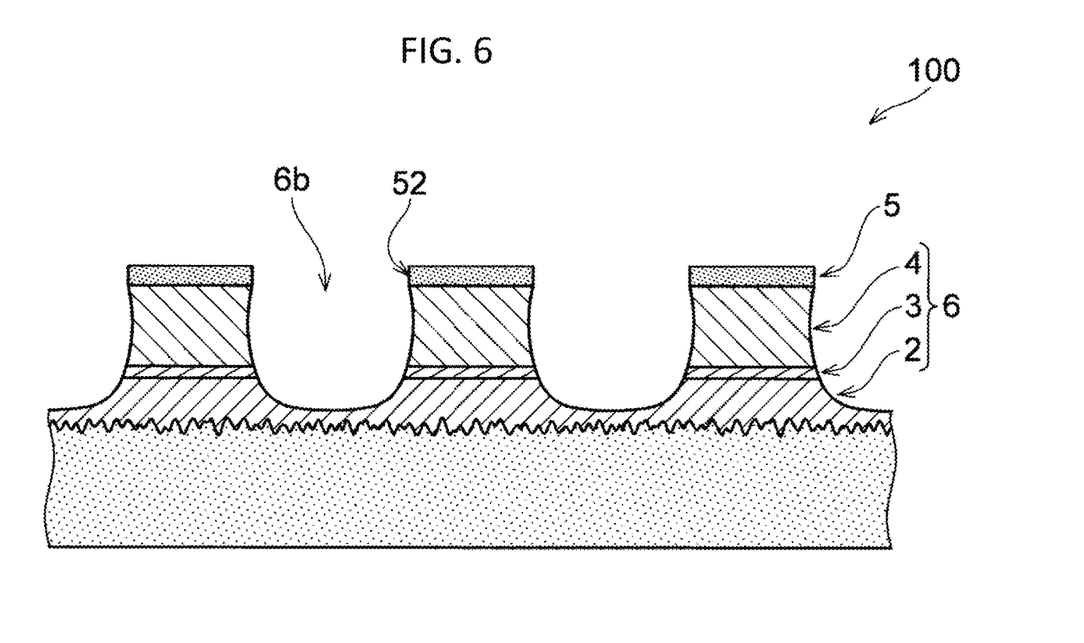
FIG. 6 is a cross-sectional view illustrating yet another example of the first etching process in the method for manufacturing a wiring substrate according to the embodiment of the present invention.

Modified embodiments of the example of FIG. 2D regarding the first etching process are described with reference to FIGS. 5 and 6. FIGS. 5 and 6 respectively illustrate states after the completion of the first etching process.

The example in FIG. 5 is an example in which the first etching process is performed until a part of the metal foil 2 is completely removed in the thickness direction and a part of the insulating layer 1 is exposed. That is, in the method for manufacturing the wiring substrate of the present embodiment, the first etching process may include exposing a part of the insulating layer 1 by completely removing a part of the metal foil 2 in the thickness direction.

When the first etching process is performed as in the example of FIG. 5, except for unintended side etching, the second etching process removes only the metal foil 2 that has entered the recesses (1c) of the insulating layer 1. The processing time of the second etching process can be further shortened. An etching amount of the metal foil 2 by the first etching process may be selected according to an ability for dissolving the metal foil 2 and a side etching characteristic of each of the first etching process and the second etching process, and further, according the thickness of the metal foil 2. According to a result of the selection, as illustrated in FIG. 5, the first etching process may be performed until the insulating layer 1 is exposed. That is, a part of the metal foil 2 exposed after the removal of the plating film 4 in the first etching process may be completely removed in the thickness direction by the first etching process.

Unlike the example of FIG. 2D, the example of FIG. 6 is an example in which the cavities (6b) each having an opening width substantially the same as the opening width of each of the openings 52 of the etching resist 5 are formed in the conductor layer 6 by the first etching process. Also in the example of FIG. 6, by performing the second etching process after the removal of the etching resist 5 in addition to the first etching process, occurrence of residues can be suppressed and the metal foil 2 can be appropriately removed. As described above, this is because an etching solution (the second etching solution) suitable for the metal foil 2 can be easily selected, and the inflow openings for the second etching solution to the cavities 6b) shift to the metal foil 2 side due to the removal of the etching resist 5. As in the example of FIG. 6, the first etching process, in which the cavities (6b) each having an opening width substantially the same as the opening width of the etching resist 5 are formed, can be realized, for example, by adjusting a content of a side etching inhibitor in the first etching solution or the like.

The method for manufacturing the wiring substrate of the embodiment is not limited the method described with reference to the drawings. For example, it is also possible that the recesses (1c) are not formed on the surface (1a) of the insulating layer 1. It is also possible that the etching resist 5 is formed of an inorganic material, and the openings 52 are formed using a method other than exposure and development. It is also possible that the first etching solution and the second etching solution are each an etching solution other than an iron chloride etching solution, a copper chloride etching solution, or a sulfuric acid-hydrogen peroxide etching solution. In the method for manufacturing the wiring substrate of the embodiment, it is also possible that any process other than the processes described above is added, or some of the processes described above are omitted.

In the method for manufacturing a wiring board described in Japanese Patent Application Publication No. 2000-323814, a copper plating layer that has not been completely removed, that is, a conductor, may remain on a surface of the insulating layer exposed by the removal of the copper plating layer by etching. A conductor remaining between conductor patterns on the insulating layer may reduce insulation between the conductor patterns.

A method for manufacturing a wiring substrate according to an embodiment of the present invention includes: preparing an insulating layer having a metal foil on at least one surface thereof; forming a plating film on the metal foil; partially forming an etching resist on the plating film; exposing a part of the metal foil by removing the plating film exposed from the etching resist by a first etching process; removing the etching resist; and forming a conductor layer including a predetermined conductor pattern by removing an exposed portion of the metal foil by a second etching process. The etching resist is removed before the second etching process.

According to an embodiment of the present invention, a wiring substrate having a desired conductor pattern and having high insulation reliability can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a wiring substrate, comprising:
    forming a plating film on a metal foil laminated on a surface of an insulating layer;
    forming an etching resist on the plating film such that the etching resist has an opening for forming a conductor pattern;
    conducting a first etching process such that part of the plating film exposed from the opening of the etching resist is removed and that part of the metal foil is exposed;
    removing the etching resist from the plating film on the metal foil laminated on the surface of an insulating layer; and
    conducting a second etching process such that the part of the metal foil exposed by the first etching process is removed and that a conductor layer having the conductor pattern is formed on the surface of the insulating layer.

2. The method for manufacturing a wiring substrate according to claim 1, wherein the forming of the plating film includes forming a metal film on the metal foil, and forming the plating film comprising an electrolytic plating film on the metal film.

3. The method for manufacturing a wiring substrate according to claim 1, wherein the metal foil is a copper foil, and the forming of the plating film includes forming the plating film comprising an electrolytic plating film comprising copper.

4. The method for manufacturing a wiring substrate according to claim 1, wherein the first etching process includes partially removing the metal foil such that part of the insulating layer is exposed.

5. The method for manufacturing a wiring substrate according to claim 1, wherein the second etching process includes removing metal residues of the metal foil in recesses of the surface of the insulating layer.

6. The method for manufacturing a wiring substrate according to claim 1, wherein the first etching process includes applying an etching solution comprising copper chloride.

7. The method for manufacturing a wiring substrate according to claim 1, wherein the second etching process includes applying an etching solution comprising sulfuric acid and hydrogen peroxide.

8. The method for manufacturing a wiring substrate according to claim 1, wherein the second etching process includes applying an etching solution comprising an additive having a side etching inhibitory effect.

9. The method for manufacturing a wiring substrate according to claim 1, wherein the forming of the etching resist includes forming the opening, and the first etching process includes removing the part of the plating film exposed by the opening of the etching resist such that a width of a cavity formed by the removing of the part of the plating film becomes larger than a width of the opening of the etching resist.

10. The method for manufacturing a wiring substrate according to claim 1, wherein the second etching process is conducted after the removing of the etching resist from the plating film on the metal foil laminated on the surface of an insulating layer.

11. The method for manufacturing a wiring substrate according to claim 1, wherein the second etching process is conducted before the removing of the etching resist from the plating film on the metal foil laminated on the surface of an insulating layer.

12. A wiring substrate, comprising:
    the conductor layer having the conductor pattern produced by the method of claim 1.

13. A wiring substrate, comprising:
    the conductor layer having the conductor pattern produced by the method of claim 10.

14. A wiring substrate, comprising:
    the conductor layer having the conductor pattern produced by the method of claim 11.

15. The method for manufacturing a wiring substrate according to claim 2, wherein the metal foil is a copper foil, and the forming of the plating film includes forming the plating film comprising an electrolytic plating film comprising copper.

16. The method for manufacturing a wiring substrate according to claim 2, wherein the first etching process includes partially removing the metal foil such that part of the insulating layer is exposed.

17. The method for manufacturing a wiring substrate according to claim 2, wherein the second etching process includes removing metal residues of the metal foil in recesses of the surface of the insulating layer.

18. The method for manufacturing a wiring substrate according to claim 2, wherein the first etching process includes applying an etching solution comprising copper chloride.

19. The method for manufacturing a wiring substrate according to claim 2, wherein the second etching process includes applying an etching solution comprising sulfuric acid and hydrogen peroxide.

20. The method for manufacturing a wiring substrate according to claim 2, wherein the second etching process includes applying an etching solution comprising an additive having a side etching inhibitory effect.

* * * * *